US012087592B2

(12) United States Patent
Tsai et al.

(10) Patent No.: US 12,087,592 B2
(45) Date of Patent: *Sep. 10, 2024

(54) AMBIENT CONTROLLED TWO-STEP THERMAL TREATMENT FOR SPIN-ON COATING LAYER PLANARIZATION

(71) Applicant: Taiwan Semiconductor Manufacturing Co., Ltd., Hsinchu (TW)

(72) Inventors: Chen-Fong Tsai, Hsinchu (TW); Ya-Lun Chen, Hsinchu (TW); Tsai-Yu Huang, Hsinchu (TW); Yahru Cheng, Hsinchu (TW); Huicheng Chang, Hsinchu (TW); Yee-Chia Yeo, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/446,416

(22) Filed: Aug. 8, 2023

(65) Prior Publication Data

US 2023/0386852 A1 Nov. 30, 2023

Related U.S. Application Data

(62) Division of application No. 16/951,955, filed on Nov. 18, 2020, now Pat. No. 11,901,189.

(60) Provisional application No. 62/982,692, filed on Feb. 27, 2020.

(51) Int. Cl.
H01L 21/3105 (2006.01)
G03F 7/16 (2006.01)
H01L 21/027 (2006.01)
H01L 21/311 (2006.01)

(52) U.S. Cl.
CPC ........ H01L 21/31058 (2013.01); G03F 7/162 (2013.01); G03F 7/168 (2013.01); H01L 21/0276 (2013.01); H01L 21/31144 (2013.01)

(58) Field of Classification Search
CPC ........... H01L 21/31058; H01L 21/0276; H01L 21/31144; H01L 21/02115; H01L 21/02282; H01L 21/76816; G03F 7/162; G03F 7/168; G03F 7/38
USPC ................................. 438/702; 430/330, 327
See application file for complete search history.

(56) References Cited

U.S. PATENT DOCUMENTS

| 4,665,007 A | 5/1987 | Cservak et al. |
| 11,901,189 B2 * | 2/2024 | Tsai ................. H01L 21/31144 |
| 2019/0067021 A1 | 2/2019 | Kori et al. |

* cited by examiner

Primary Examiner — Caleen O Sullivan
(74) Attorney, Agent, or Firm — Seed IP Law Group LLP

(57) ABSTRACT

To reduce a thickness variation of a spin-on coating (SOC) layer that is applied over a plurality of first and second trenches with different pattern densities as a bottom layer in a photoresist stack, a two-step thermal treatment process is performed on the SOC layer. A first thermal treatment step in the two-step thermal treatment process is conducted at a first temperature below a cross-linking temperature of the SOC layer to cause flow of the SOC layer, and a second thermal treatment step in the two-step thermal treatment process is conducted at a second temperature to cause cross-linking of the SOC layer.

20 Claims, 12 Drawing Sheets

AMBIENT CONTROLLED TWO-STEP THERMAL TREATMENT FOR SPIN-ON COATING LAYER PLANARIZATION

PRIORITY CLAIM AND CROSS-REFERENCE

This application is a divisional of U.S. application Ser. No. 16/951,955, filed Nov. 18, 2020, which claims the benefit of U.S. Provisional Patent Application No. 62/982,692, filed Feb. 27, 2020, the disclosures of which are incorporated by reference herein in their entireties.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers over a semiconductor substrate, and patterning the various material layers using lithography to form circuit components over and/or in the substrate.

BRIEF DESCRIPTION OF THE DRAWINGS

The present disclosure is best understood from the following detailed description when read in conjunction with the accompanying drawings. It is emphasized that, according to common practice, the various features of the drawings are not necessarily to scale. On the contrary, the dimensions and spatial relationship(s) of the various features may be arbitrarily enlarged or reduced for clarity Like reference numerals denote like features throughout specification and drawings.

DETAILED DESCRIPTION

Figure 1:
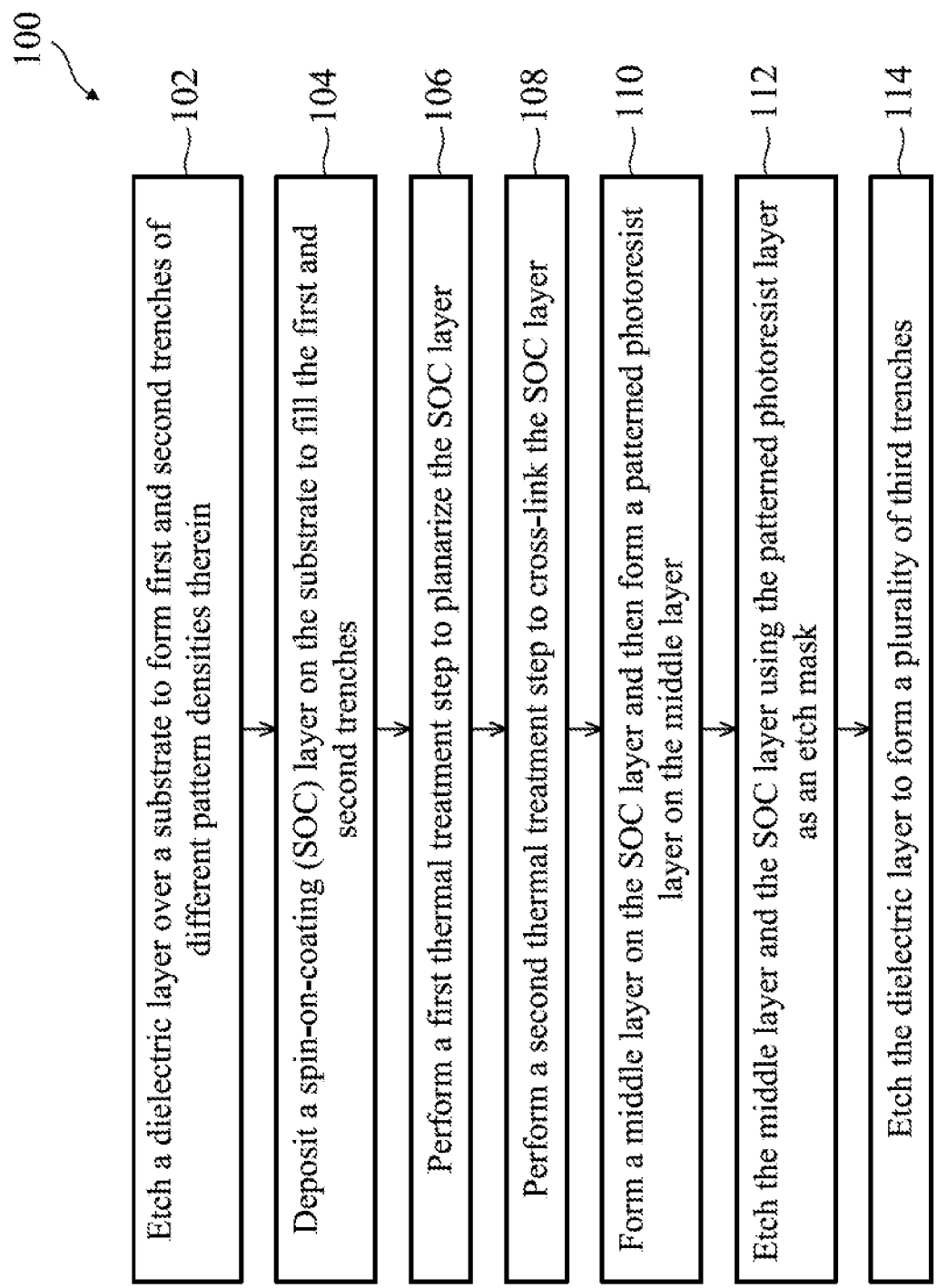
FIG. 1 is a flowchart of a method of fabricating a semiconductor structure, in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A typical lithography patterning process for forming patterned features involves applying a photoresist, and defining patterns in the photoresist using a photomask. The patterns in the patterned photoresist are then transferred to the underlying layer through an etching step, wherein the patterned photoresist is used as an etch mask. After the etching step, the patterned photoresist is removed.

With the increasing down-scaling of semiconductor devices, multiple lithography patterning processes are adapted to print the features that are smaller than the single exposure lithographic resolution limit. In multiple patterning processes, a spin-on-coating (SOC) layer is often used to smooth topographical features so that a photoresist layer subsequently formed on the SOC layer exhibits less substantial thickness variations. However, when such SOC layer is applied over the patterned features on a substrate, the layer thickness varies across the substrate depending upon the pattern density of the features that underlie the SOC layer. Usually a portion of the SOC layer in a topographically dense region (i.e., the region with features having a relatively high pattern density) is thicker than another portion of the SOC layer in an isolated region (i.e., the region with features having a relatively low pattern density). The thickness variation of the SOC layer can cause critical dimension (CD) enlargement in the isolated region and/or pattern under-etch in the dense region after the subsequent patterning process, which affects the patterning integrity and reduces the fabrication yield.

In some embodiments of the present disclosure, after forming a SOC layer on a substrate containing features of different pattern densities, a two-step thermal treatment process is performed in which the first thermal treatment step is conducted to modulate the flow capacity (e.g., viscosity) of the SOC layer, thereby allowing the leveling of the SOC layer to reduce the thickness variation at regions of different pattern densities, and the second thermal treatment step is conducted to harden the SOC layer. A thickness variation improvement of at least 50% may be realized in the SOC layer by the two-step thermal treatment process of the present disclosure.

FIG. 1 is a flowchart of a method 100 of fabricating a semiconductor structure 200, in accordance with some embodiments of the present disclosure. FIGS. 2A-2G are cross-sectional views of the semiconductor structure 200 in various stages of the method 100, in accordance with some embodiments. The method 100 is discussed in detail below, with reference to the semiconductor structure 200, in FIGS. 2A-2G. In some embodiments, additional operations are performed before, during, and/or after the method 100, or some of the operations described are replaced and/or eliminated. In some embodiments, additional features are added to the semiconductor structure 200. In some embodiments, some of the features described below are replaced or eliminated. One of ordinary skill in the art would understand that although some embodiments are discussed with operations performed in a particular order, these operations may be performed in another logical order.

Figure 2A:
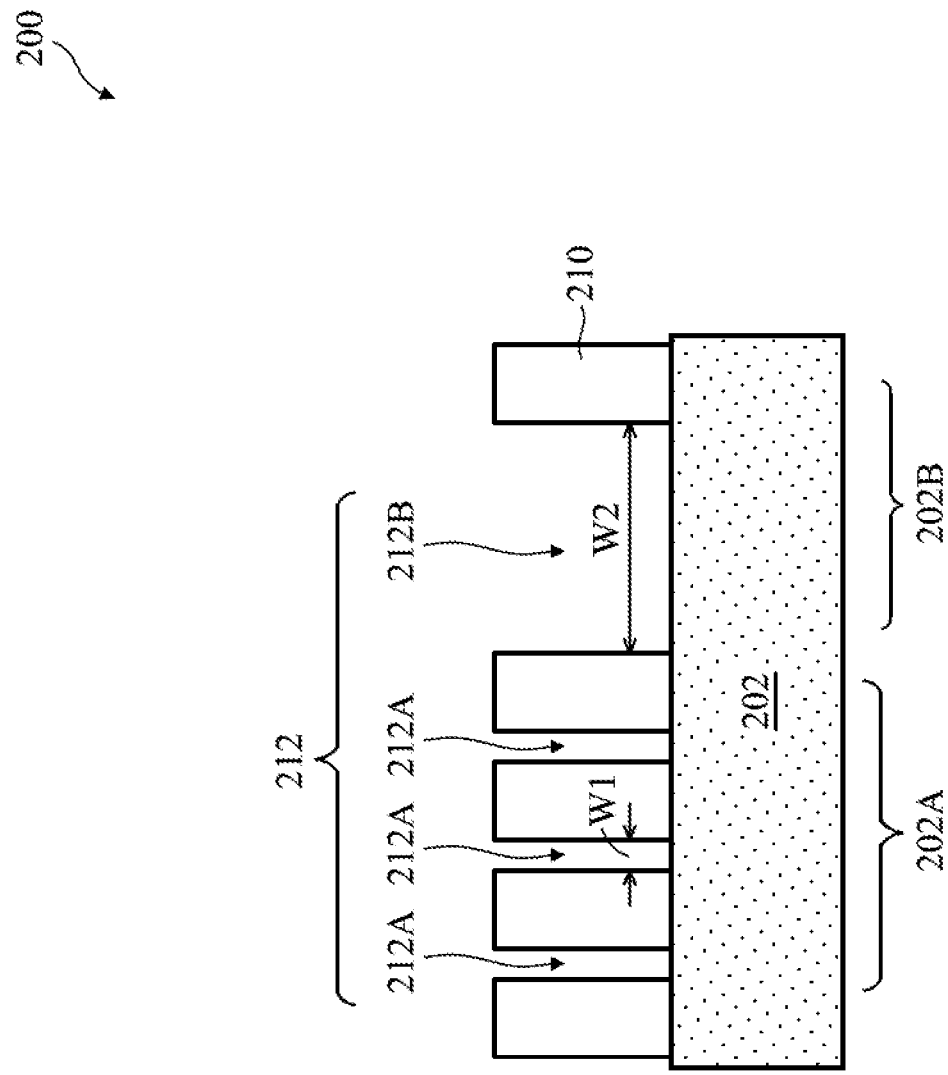
FIGS. 2A-2G are cross-sectional views of a semiconductor structure in various stages of the method of FIG. 1, in accordance with some embodiments.

Referring to FIGS. 1 and 2A, the method 100 includes operation 102, in which a dielectric layer 210 over a substrate 202 is etched to form a plurality of trenches 212. FIG. 2A is a cross-sectional view of a semiconductor structure 200 after etching the dielectric layer 210 to form the plurality of trenches 212.

The substrate 202 is first provided. In some embodiments, the substrate 202 is a bulk semiconductor substrate including silicon. Alternatively or additionally, in some embodiments the bulk semiconductor substrate includes another elementary semiconductor such as germanium, a compound semiconductor including gallium arsenide, gallium, phosphide, indium phosphide, indium arsenide, and/or indium antimonide, an alloy semiconductor including SiGe, GaAsP, AlInAs, AlGaAs, GaInAs, GaInP, and/or GaInAsP; or combinations thereof. In some embodiments, the substrate 202 includes an epitaxial layer. For example, the substrate 202 has an epitaxial layer overlying a bulk semiconductor substrate. Furthermore, in some embodiments, the substrate 202 is a semiconductor on insulator (SOI) substrate. For example, the substrate 202 includes a buried oxide (BOX) layer formed by a process such as separation by implanted oxygen (SIMOX) or other suitable techniques, such as wafer bonding and grinding.

In some embodiments, the substrate 202 further includes active devices such as p-type field effect transistors (PFET), n-type FET (NFET), metal-oxide semiconductor (MOS) transistors, complementary metal-oxide semiconductor (CMOS) transistors, bipolar transistors, high voltage transistors, and/or high frequency transistors. In some embodiments, the transistors are planar transistors or three-dimensional fin-type transistors. In some embodiments, the substrate 202 further includes passive devices such as resistors, capacitors, and/or inductors. The substrate 202 further includes isolation structures such as shallow trench isolation (STI) structures to separate various active and/or passive devices from one another.

The dielectric layer 210 is deposited over the substrate 202. In some embodiments and as in FIG. 2A, the dielectric layer 210 is deposited directly above and in contact with the substrate 202. In some embodiments, one or more dielectric layers containing contact structures therein are disposed between the dielectric layer 210 and the substrate 202.

In some embodiments, the dielectric layer 210 includes silicon oxide. In some embodiments, the dielectric layer 210 includes a low-k dielectric material having a dielectric constant (k) less than 4. In some embodiments, the low-k dielectric material has a dielectric constant from about 1.2 to about 3.5. "About," as used herein, denotes that the actual value may be somewhat more or somewhat less than the stated value or range, to within ±20% of the stated value. In other embodiments, about means that the actual value is within ±15% of the stated value. In other embodiments, about means that the actual value is within ±10% of the stated value. In other embodiments, about means that the actual value is within ±5% of the stated value. In other embodiments, about means that the actual value is within ±1% of the stated value. In some embodiments, the dielectric layer 210 includes tetraethylorthosilicate (TEOS) oxide, undoped silicate glass, or doped silicate glass such as borophosphosilicate glass (BPSG), fluorosilica glass (FSG), phosphosilicate glass (PSG), boron doped silicon glass (BSG), and/or other suitable dielectric materials. In some embodiments, the dielectric layer 210 is deposited by chemical vapor deposition (CVD), plasma enhanced chemical vapor deposition (PECVD), physical vapor deposition (PVD), or spin coating. In some embodiments, the dielectric layer 210 is planarized by a planarization process or otherwise recessed to provide a planar top surface. In some embodiments, the top surface of the dielectric layer 210 is planarized using a chemical mechanical planarization (CMP) process.

The dielectric layer 210 is subsequently etched to form a plurality of trenches 212 therein. In some embodiments, the plurality of trenches 212 includes a plurality of first trenches 212A formed in a first region 202A of the substrate 202 and one or more of second trenches 212B (only one is shown) formed in a second region 202B of the substrate 202. In some embodiments, the first region 202A is a high pattern density region where the pattern density of the trenches is relatively high, while the second region 202B is a low pattern density region where the pattern density of the trenches is relatively low. The first trenches 212A in the first region 202A each have a width W1 that is relatively small, and the second trench 212B in the second region 202B has a width W2 that is relatively large. In some embodiments and as shown in FIG. 2A, the first and second trenches 212A, 212B are formed to extend through the dielectric layer 210, exposing a surface of the substrate 202. In some other embodiments, the first and second trenches are formed to extend into a portion of the dielectric layer 210, exposing a sublayer of the dielectric layer 210 (not shown).

The dielectric layer 210 is etched with one or more lithography and etching processes. In some embodiments, the lithography process includes applying a photoresist layer (not shown) over the dielectric layer 210, exposing the photoresist layer to a pattern of openings, performing post-exposure baking, and developing the resist to form a patterned photoresist layer (not shown). The patterned photoresist layer exposes portions of the dielectric layer 210 where the first and second trenches 212A, 212B are to be formed. Next, the portions of the dielectric layer 210 exposed by the patterned photoresist layer are etched to form the first and second trenches 212A, 212B. In some embodiments, the dielectric layer 210 is etched using a dry etch such as, for example, a reactive ion etch (RIE) or a plasma etch. In some embodiments, the dielectric layer 210 is etching using a wet etch. After formation of the first and second trenches 212A, 212B in the dielectric layer 210, the patterned photoresist layer is removed, for example, by wet stripping or plasma ashing. Alternatively, in some embodiments, a hard mask is used such that the trench pattern is transferred from the pattered photoresist layer to the hard mask by a first etch and then transferred to the dielectric layer 210 by a second etch.

Figure 2B:
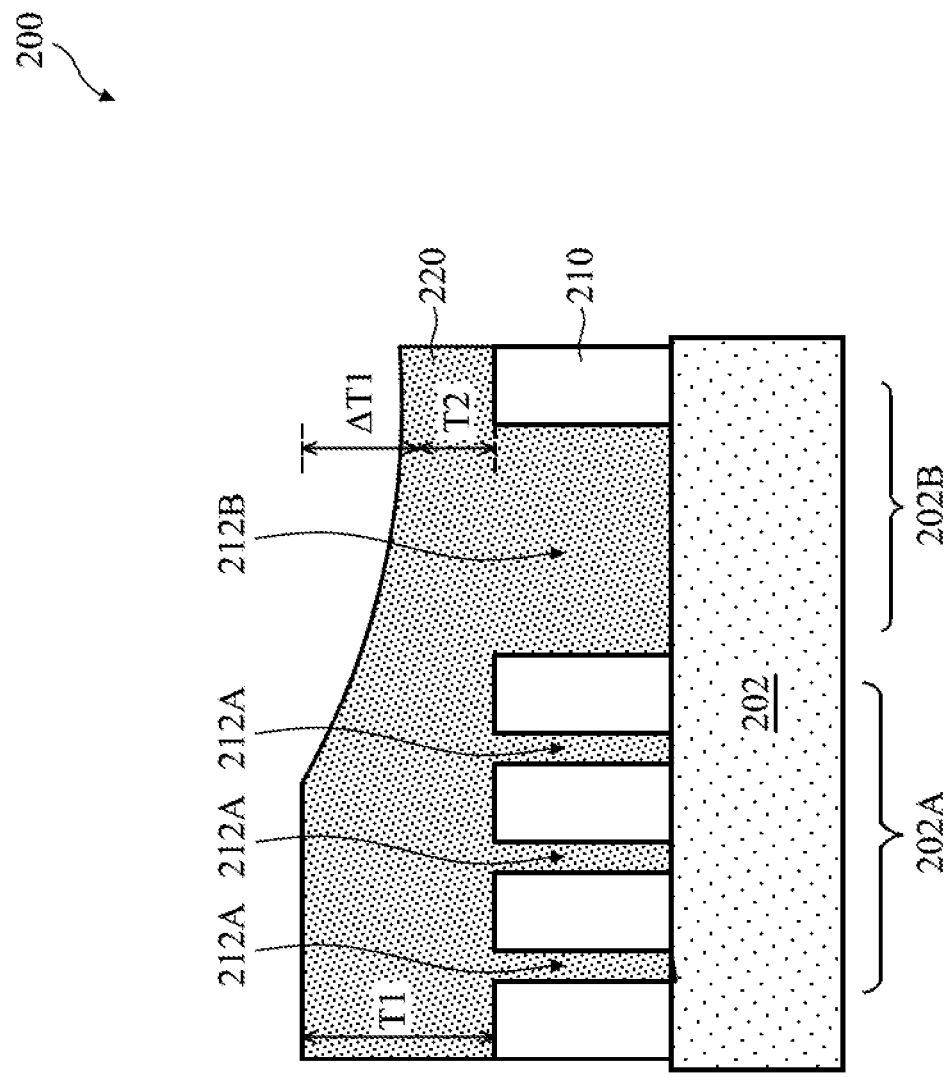

Referring to FIGS. 1 and 2B, the method 100 proceeds to operation 104, in which a SOC layer 220 is deposited on the substrate 202 to fill the first and second trenches 212A, 212B. FIG. 2B is a cross-sectional view of the semiconductor structure 200 of FIG. 2A after depositing the SOC layer 220 on the substrate 202 to fill the first and second trenches 212A, 212B.

The SOC layer 220 may be a bottom layer of a tri-layer patterning stack, also referred to as a tri-layer resist. In some embodiments, the SOC layer 220 includes a precursor polymer that can be cross-linked at an elevated temperature. In some embodiments, the precursor polymer contains cross-linkable functional groups such as —OH, —SH, —NH$_2$, NH—, —CO—NH$_2$, —CO—NH—, —O—CO—

NH—, —NH—CO—NH—, —CO—OH, CO—O—, —CO—O—, —CS—OH, —CO—SH, —CS—SH, —CO—O—CO—, —SO$_3$H, SO$_2$(O—), —PO$_3$H$_2$, —PO(O—)$_2$, —SO$_2$—NH$_2$, —SO$_2$—NH—, —CO—CH$_2$—CO—, CH═CH—, —CH═CH$_2$, ═CO—CH═CH$_2$, —CO—C(CH$_3$)═CH$_2$, or epoxy including

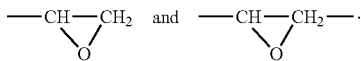

In some embodiments, the precursor polymer includes C, O, and H, and optionally including Si and/or F. In some embodiments, the precursor polymer is a non-photoactive polymer.

In some embodiments, the SOC layer 220 is applied by spin coating. Other suitable solution application techniques such as spray coating, dip coating, and inkjet printing can also be used to form the SOC layer 220. In the spin coating process, the precursor polymer is initially dissolved in a suitable solvent to form a solution of the precursor polymer. Examples of solvents include, but are not limited to acetone, chloroform, ethyl acetate, toluene, xylene, and methyl ethyl ketone. Thereafter, the surface of the substrate 202 is coated with the solution of the precursor polymer and the substrate 202 is then spun to form the SOC layer 220 on the substrate 202. The spin coating process is carried out under an ambient atmosphere, e.g., in air, at a temperature from room temperature to about 80° C. The thickness of the SOC layer 220 is controlled such that a top surface of the SOC layer 220 is above the top surface of the dielectric layer 210. Accordingly, the first and second trenches 212A, 212B are completely filled by the SOC layer 220. In some embodiments, the SOC layer 220 has a thickness ranging from about 5 nm to about 500 nm. The thickness of the SOC layer 220 is affected by the concentration of the precursor polymer solution and the conditions of spinning coating (e.g., spinning speed and spinning time). In some embodiments, the spinning speed is set from about 200 rate per minute (rpm) to about 500 rpm.

The substrate 202 contains trenches of different pattern densities. As the SOC layer 220 is applied over the substrate 202, the layer thickness variation in regions with different pattern densities occurs. Accordingly, as shown in FIG. 2B, the thickness T1 of the SOC layer 220 in the high pattern density region, i.e., first region 202A is greater than the thickness T2 of the SOC layer 220 in the low pattern density region, i.e., second region 202B. The thickness difference ΔT between the high pattern density region 202A and the neighboring low pattern density region 202B may be as high as about 100 nm to about 300 nm, or even higher. Such high thickness difference can cause under-etch in the high pattern density region 202A and/or CD enlargement in the low pattern density region 202B, which adversely affects the integrity of the subsequent patterning process.

In some embodiments, after deposition, a soft bake process is performed on the SOC layer 220 to drive the bulk of the solvent out of the SOC layer 220 and increase mechanical strength of the SOC layer 220. In some embodiments, the soft bake is carried out at a temperature from about 80° C. to about 110° C. for a bake time of from about 30 seconds to 10 minutes. In some embodiments, the soft bake is performed under an ambient atmosphere with an oxygen level, for example, greater than 20%. After the soft baking step, the SOC layer 220 is essentially free of solvent.

Figure 2C:
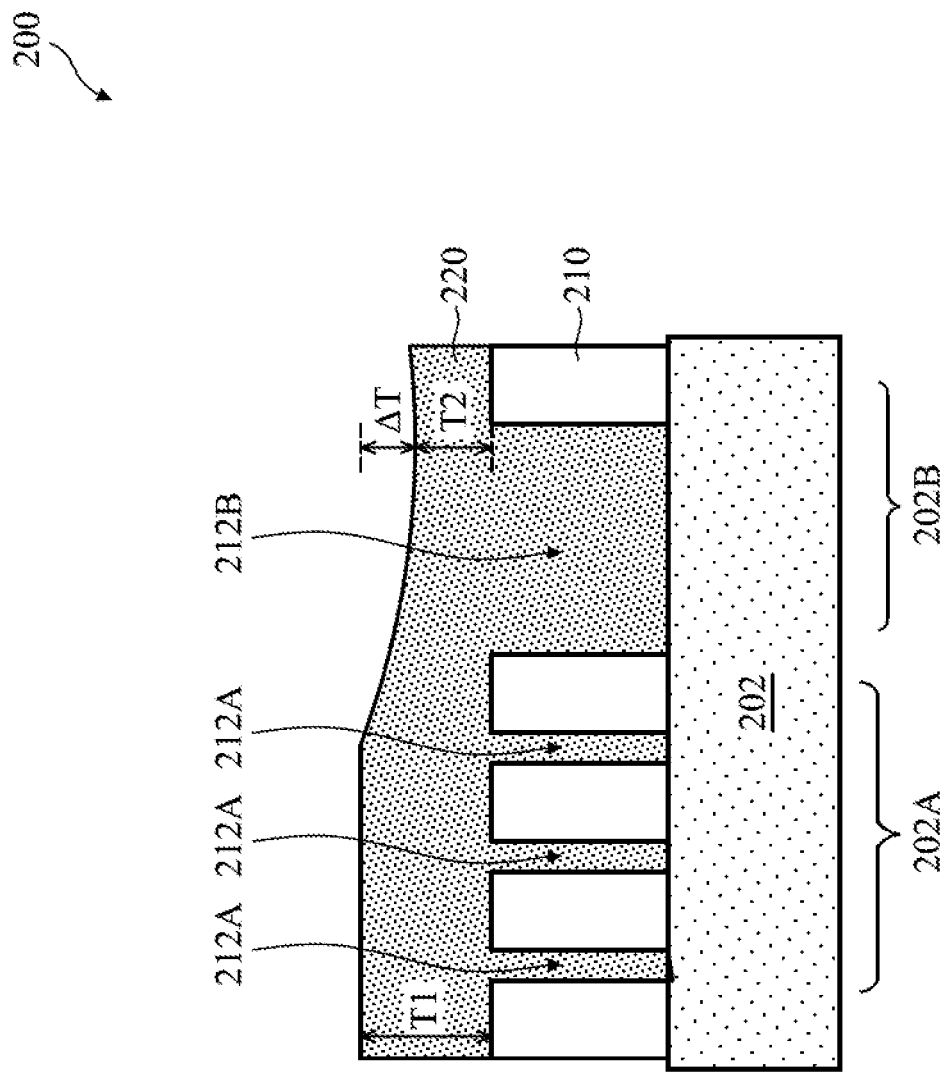

Referring to FIGS. 1 and 2C, the method 100 proceeds to operation 106, in which a first thermal treatment step in a two-step thermal treatment process is performed to planarize the SOC layer 220. FIG. 2C is a cross-sectional view of the semiconductor structure 200 of FIG. 2B after the first thermal treatment step that planarize the SOC layer 220.

The first thermal treatment step is a low temperature thermal treatment step, in which the temperature is controlled to reduce the viscosity of the precursor polymer in the SOC layer 220, but does not cause the cross-linking of the precursor polymer. The reduced viscosity allows the precursor polymer to flow easily, which results in the planarization of the SOC layer 220. The temperature in the first thermal treatment step thus is set to be lower than the cross-linking temperature of the precursor polymer. In some embodiments, the first thermal treatment temperature is set to be at least 20° C. lower than the cross-linking temperature of the precursor polymer. In some embodiments, the first thermal treatment temperature is from about 120° C. to about 200° C. The first thermal treatment step is carried out under an inert atmosphere (e.g., nitrogen, argon) with oxygen level less than about 5%, less than about 4%, less than about 3%, less than about 2%, or less than about 1%. In some embodiments, the inert atmosphere contains less than 1% of oxygen. If the oxygen level is too high, the cross-linking of the polymer precursor in the SOC layer 220 may occur at the first thermal treatment stage. In some embodiments, the SOC layer 220 is heated for about 15 seconds to 10 minutes. Longer thermal treatment time is needed for structures with higher pattern densities and/or precursor polymers with high viscosity.

The first thermal treatment step helps to reduce the thickness variation of the SOC layer 220 across the substrate 202. As shown in FIG. 2C, after the first thermal treatment step, the thickness difference ΔT of the SOC layer 220 between the high pattern density region 202A and the low pattern density region 202B is reduced. In some embodiments, a thickness variation improvement of at least 50% is realized. The reduced thickness variation of the SOC layer 220 helps to reduce the etching defects during the subsequent patterning process, which in turn helps to increase the production yield.

Figure 2D:
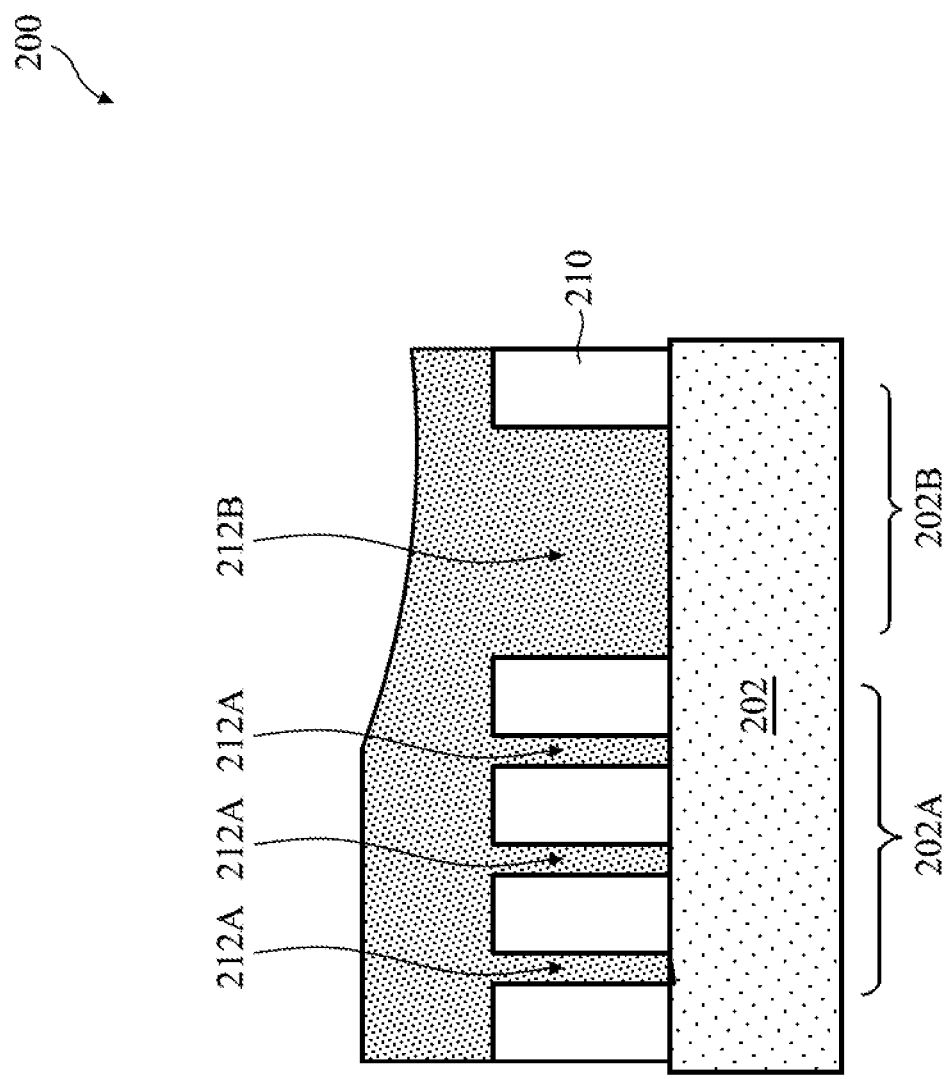

Referring to FIGS. 1 and 2D, the method 100 proceeds to operation 108, in which a second thermal treatment step in the two-step thermal treatment process is performed to cross-link the SOC layer 220. FIG. 2D is a cross-sectional view of the semiconductor structure 200 of FIG. 2C after the second thermal treatment step that cross-links the SOC layer 220.

The second thermal treatment step is a high temperature thermal treatment step, in which the temperature is controlled to induce the cross-linking of the precursor polymer in the SOC layer 220. The cross-linking hardens the SOC layer 220 and renders it insoluble in solvents such as photoresist strippers and solvents for dissolving materials being subsequently deposited thereon. In some embodiments, the second thermal treatment temperature is set to be from 150° C. to 300° C. The second thermal treatment step is carried out in an ambient atmosphere having an oxygen level greater than that of the first thermal treatment step. In some embodiments, the ambient atmosphere has an oxygen level greater than about 20%. The higher oxygen level helps to facilitate the cross-linking of the precursor polymer.

Figure 2E:
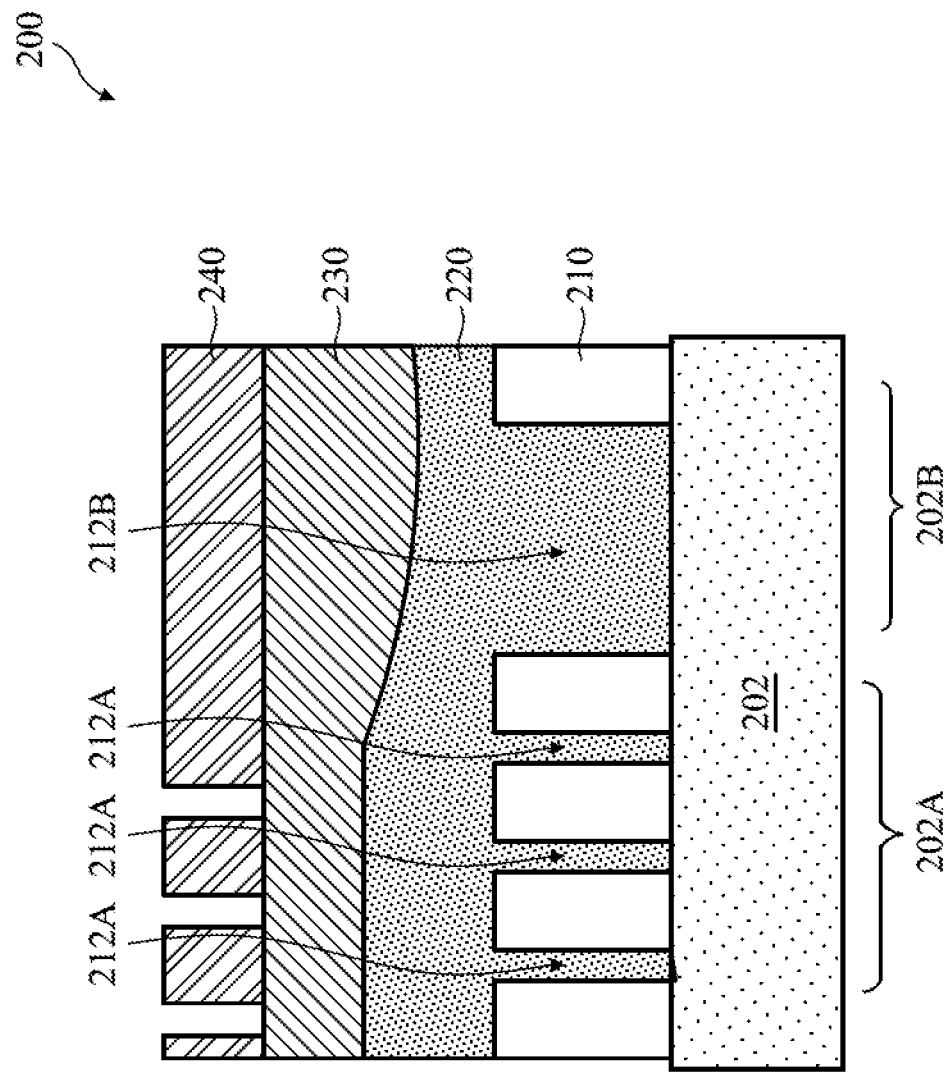

Referring to FIGS. 1 and 2E, the method 100 proceeds to operation 110, in which a middle layer 230 is formed on the SOC layer 220, followed by forming a patterned photoresist layer 240 on the middle layer 230. FIG. 2E is a cross-sectional view of the semiconductor structure 200 of FIG. 2D after forming the middle layer 230 on the SOC layer 220 and then forming the patterned photoresist layer 240 on the middle layer 230.

In some embodiments, the middle layer 230 is a second layer of the trilayer patterning stack. The middle layer 230 may have a composition that provides anti-reflective properties and/or hard mask properties for the lithography process. In some embodiments, the middle layer 230 includes a silicon containing layer (e.g., silicon hard mask material). In some embodiments, the middle layer 230 includes a silicon-containing inorganic polymer. In some embodiments, the middle layer 230 includes a siloxane polymer (e.g., a polymer having a backbone of O—Si—O—Si—, etc.). The silicon ratio of the middle layer material may be controlled such as to control the etch rate. In other embodiments, the middle layer 230 includes silicon oxide (e.g., spin-on glass (SOG)), silicon nitride, silicon oxynitride, polycrystalline silicon, a metal-containing organic polymer material that contains metal such as titanium, titanium nitride, aluminum, and/or tantalum; and/or other suitable materials.

In some embodiments, the middle layer 230 is deposited on the SOC layer 220 by CVD, PVD, or spin coating. In some embodiments, the middle layer 230 has a thickness from about 50 nm to about 200 nm.

The patterned photoresist layer 240 is then formed on the middle layer 230. The patterned photoresist layer 240 includes a plurality of openings, such that portions of the middle layer 230 are uncovered within the openings. The openings in the patterned photoresist resist layer 240 are configured according to a predetermined pattern. The patterned photoresist layer 240 may have a thickness ranging from about 10 nm to about 500 nm. The patterned photoresist layer 240 can include a positive-type resist or a negative-type resist. For advanced semiconductor patterning using an extreme ultraviolet (EUV) radiation beam, the patterned photoresist layer 240 may include a chemical amplification (CA) resist. The patterned photoresist layer 240 is formed by a lithography process that may include processing steps of resist coating, soft baking, mask aligning, exposing, post-exposure baking, developing, and hard baking.

Figure 2F:
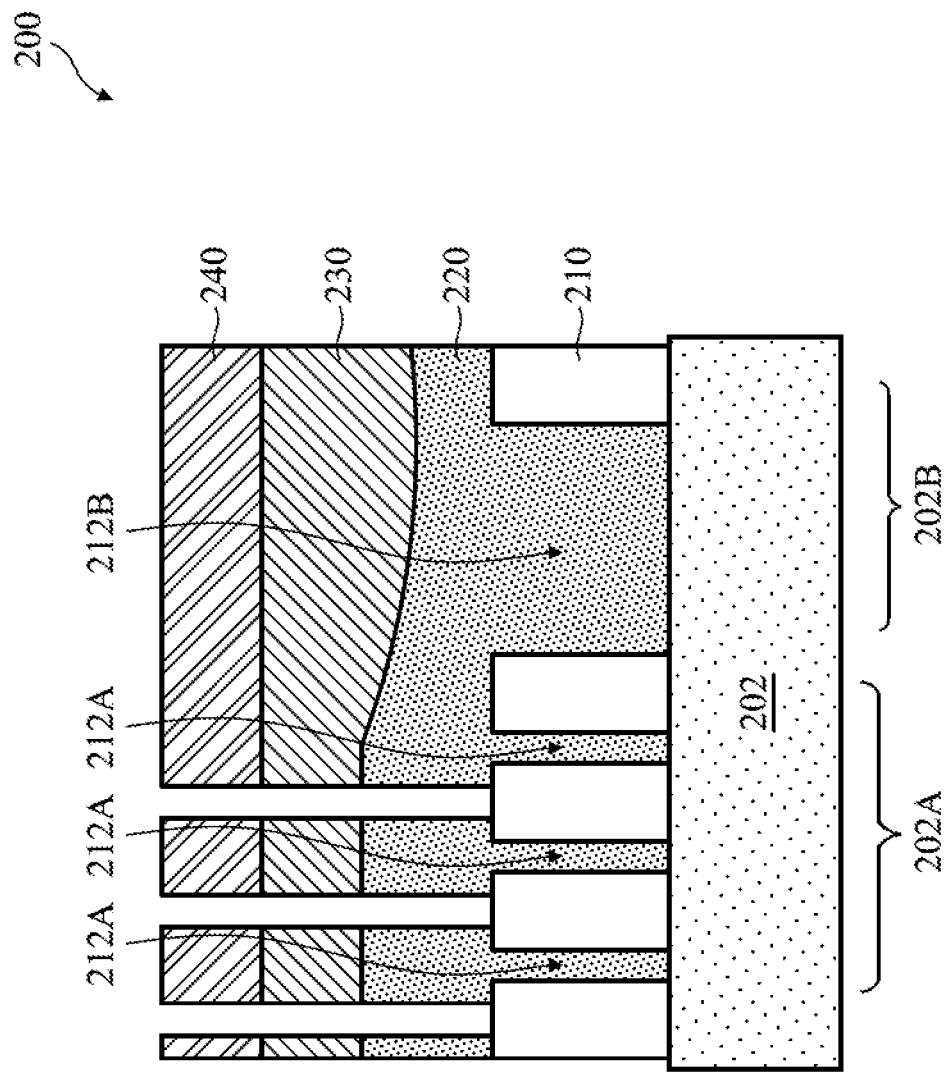

Referring to FIGS. 1 and 2F, the method 100 proceeds to operation 112, in which the middle layer 230 and the SOC layer 220 are etched using the patterned photoresist layer as an etch mask. FIG. 2F is a cross-sectional view of the semiconductor structure 200 of FIG. 2E after etching the middle layer 230 and the SOC layer 220.

At least one etching process is applied to remove materials of the middle layer 230 and the SOC layer 220 exposed by the openings of the patterned photoresist layers 240. The etching process may use a $CF_4$, $C_3F_8$, $C_4F_8$, $CHF_3$, or $CH_2F_2$ dry etch, or a buffered hydrofluoric acid (BHF) wet etch to etch the middle layer 230 and the SOC layer 220 using the patterned photoresist layer 240 as the etch mask. In some embodiments, a single etch is performed to concurrently remove materials of both middle layer 230 and SOC layer 220, to expose portions of the dielectric layer 210. In some other embodiments, the middle layer 230 and the SOC layer 220 are etched by two etching processes with different etching chemistries. For example, a first etching process is performed to etch the middle layer 230 without impacting the SOC layer 220, and then a second etching process is performed to etch the SOC layer 220 without impacting the middle layer 230. If not consumed during etching the middle layer 230 and the SOC layer 220, after etching the middle layer 230 and the SOC layer 220, the patterned photoresist layer 240 is removed, for example, by wet stripping or plasma ashing.

Figure 2G:
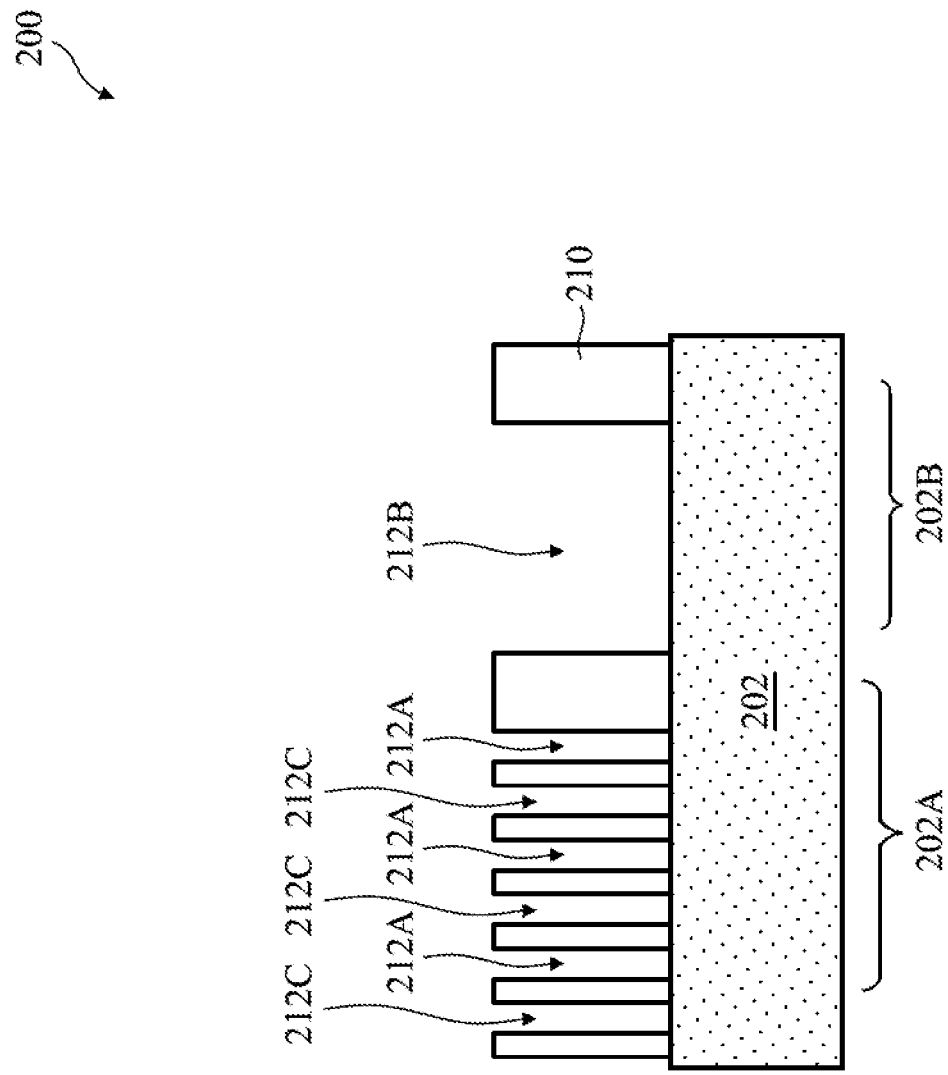

Referring to FIGS. 1 and 2G, the method 100 proceeds to operation 114, in which the dielectric layer 210 is etched to form a plurality of third trenches 212C. FIG. 2G is a cross-sectional view of the semiconductor structure 200 of FIG. 2F after etching the dielectric layer 210 to form the plurality of third trenches 212C.

An etching process is applied to the dielectric layer 210 to remove portions of the dielectric layer 210 that are exposed by the openings in the middle layer 230 and the SOC layer 220, thereby forming the third trenches 212C in the dielectric layer 210. In some embodiments, the etching process is a dry etch such as RIE or a wet etch that selectively etches the dielectric layer 210. After etching the dielectric layer 210, the middle layer 230 and SOC layer 220 are removed, for example, by plasma etch.

The two-step thermal treatment process used in the present disclosure helps to reduce the thickness variation of the SOC layer 220, and thus smoothens the topology through the entire substrate 202. The smoothened topology helps to reduce etching defects such as under-etch in the high pattern density region 202A and/or CD enlargement in the low pattern density region 202B during the dielectric layer 210 etching process. As a result, the third trenches 212C can be formed to conform to the design specification, which helps to improve the product yield.

The processes described in FIGS. 2A-2G may be used in various applications. For example, in some embodiments, the first, second, and third trenches 212A, 212B, 212C can be used as contact openings. Contact structures can be formed in these first, second, and third trenches 212A, 212B, 212C to provide electrical connections to the devices in and/or on the substrate 202.

Figure 3:
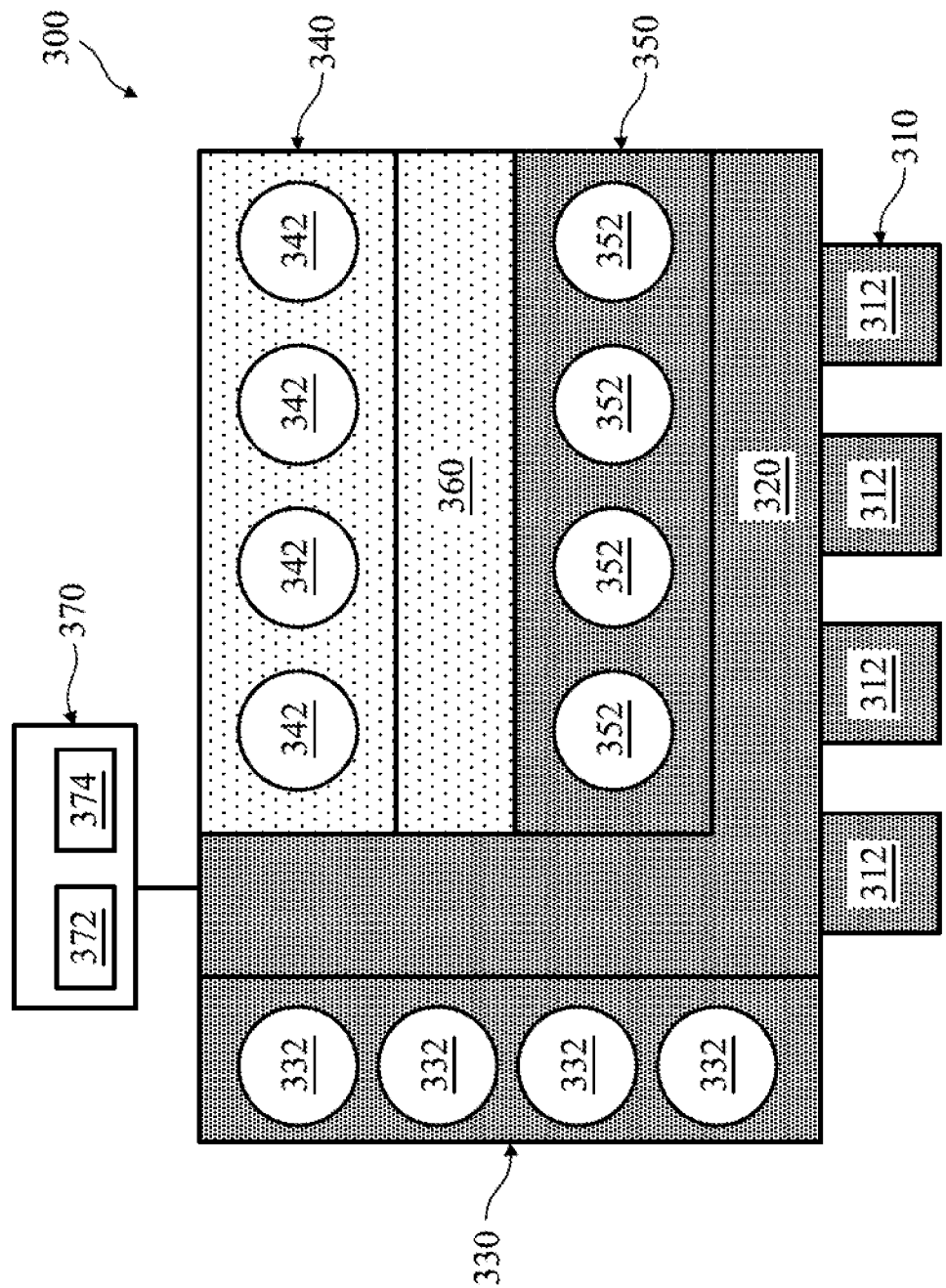
FIG. 3 is a plan view of a semiconductor processing system, in accordance with some embodiments.

FIG. 3 is a plan view of a semiconductor processing system 300 that can be used for performing the two-step thermal treatment process described above in FIGS. 2C and 2D, in accordance with some embodiments.

Referring to FIG. 3, in some embodiments, the semiconductor processing system 300 includes a loading unit 310, a first transfer unit 320, a spin coating unit 330, a first thermal treatment unit 340, a second thermal treatment unit 350, and a second transfer unit 360.

The loading unit 310 includes a plurality of load ports 312. The load ports 312 are configured to support one or more substrates.

The first transfer unit 320 is in communication with the loading unit 310, the spin coating unit 330, and the second thermal treatment unit 350. The first transfer unit 320 may include a robot (not shown) adapted to transfer substrates between the loading unit 310, the spin coating unit 330, and the second thermal treatment unit 350. In some embodiments, the first transfer unit 320 is maintained under an ambient atmosphere, e.g., in air. In some embodiment, the oxygen level in the ambient atmosphere is greater than 20%.

The spin coating unit 330 includes a plurality of spin coaters 332. The spin coater 332 is adapted to depositing a SOC layer 220 (FIG. 2B) on a substrate 202. In some embodiments, the spin coating unit 330 is maintained under an ambient atmosphere, e.g., in air. In some embodiments, the oxygen level in the ambient atmosphere is greater than 20%.

The first thermal treatment unit 340 includes a plurality of baking stations 342. The baking station 342 is adapted to perform a low temperature thermal treatment (i.e., the first thermal treatment step described above in FIG. 2C) during which the SOC layer 220 is planarized. The first thermal treatment unit 340 is maintained under an inert atmosphere. In some embodiments, the oxygen level in the first thermal treatment unit 340 is less than about 5%, less than about 4%, less than about 3%, less than about 2%, or less than about 1%. If the oxygen level is too high, the risk of the cross-linking of the polymer precursor in the SOC layer increases. The inert atmosphere is created by flowing inert gas such as nitrogen or argon into the first thermal treatment unit 340.

The second thermal treatment unit 350 includes a plurality of baking stations 352. The baking station 352 is adapted to perform a high temperature thermal treatment (i.e., the second thermal treatment step described above in FIG. 2D) during which the cross-linking of the precursor polymer providing the SOC layer 220 occurs. The first thermal treatment unit 340 is maintained under an ambient atmosphere, e.g., in air. In some embodiments, the second thermal treatment unit 350 is maintained in an atmosphere with oxygen level greater than 20%.

The second transfer unit 360 is in communication with the first transfer unit 320, the first thermal treatment unit 340, and the second thermal treatment unit 350. The second transfer unit 360 may include a robot (not shown) adapted to transfer substrates between the spin coating unit 330, the first thermal treatment unit 340, and the second thermal treatment unit 350. In some embodiments, the first transfer unit 320 is maintained under an inert atmosphere.

In some embodiments, the semiconductor processing system 300 further includes a controller 370 that controls one or more operations of the semiconductor processing system 300. For example, in various embodiments, the controller 370 may control spin coating conditions, heating temperatures, and oxygen levels. In some embodiments, the controller 370 may control operations of one or more robotic mechanisms, such as a robotic arm or movable robotic structure which may be manipulated to move the substrate 202 among different units, such as loading unit 310, first transfer unit 320, spin coating unit 330, first thermal treatment unit 340, second thermal treatment unit 350, and second transfer unit 360.

The controller 370 may include a processor 372 and a computer-readable memory 374. The memory 374 may include machine readable instructions that when executed by the processor 372, cause the controller 370 to send command signals to the one or more units of the semiconductor processing system 300, such as loading unit 310, first transfer unit 320, spin coating unit 330, first thermal treatment unit 340, second thermal treatment unit 350, and second transfer unit 360.

During operation, a substrate, for example, substrate 202 in FIG. 2A is first transferred into the spin coating unit 330 from a load port 312 via the first transfer unit 320, and in the spin coating unit 330, the substrate 202 is coated with a SOC layer 220. The load port 312, the first transfer unit 320 and the spin coating unit 330 are all maintained under an ambient atmosphere with an oxygen level, for example, greater than 20%. After deposition, in some embodiments, a soft bake step is performed under an ambient atmosphere during which the solvent in the SOC layer 200 is substantially removed. The substrate 202 is then transferred into the first thermal treatment unit 340 via the first and second transfer units 320, 360. The second transfer unit 360 and the first thermal treatment unit 340 are maintained under an inert atmosphere. In some embodiments, the inert atmosphere has an oxygen level less than about 5%, less than about 4%, less than about 3%, less than about 2%, or less than about 1%. Within the first thermal treatment unit 340, the first thermal treatment step is performed at a first temperature below the cross-linking temperature of the precursor polymer to allow the flow of the SOC layer 220 so as to reduce the thickness variation of the SOC layer 220 across the substrate 202. Next, the substrate 202 is transferred into the second thermal treatment unit 350 via the second transfer unit 360. The second thermal treatment unit 350 is maintained under an ambient atmosphere. In some embodiments, the ambient atmosphere has an oxygen level greater than 20%. Within the second thermal treatment unit 350, the second thermal treatment step is performed at a second temperature above the cross-linking temperature of the precursor polymer to cross-link the precursor polymer. The resulting cross-linked SOC layer 220 thus has a reduced thickness variation across the substrate 202.

Figure 4:
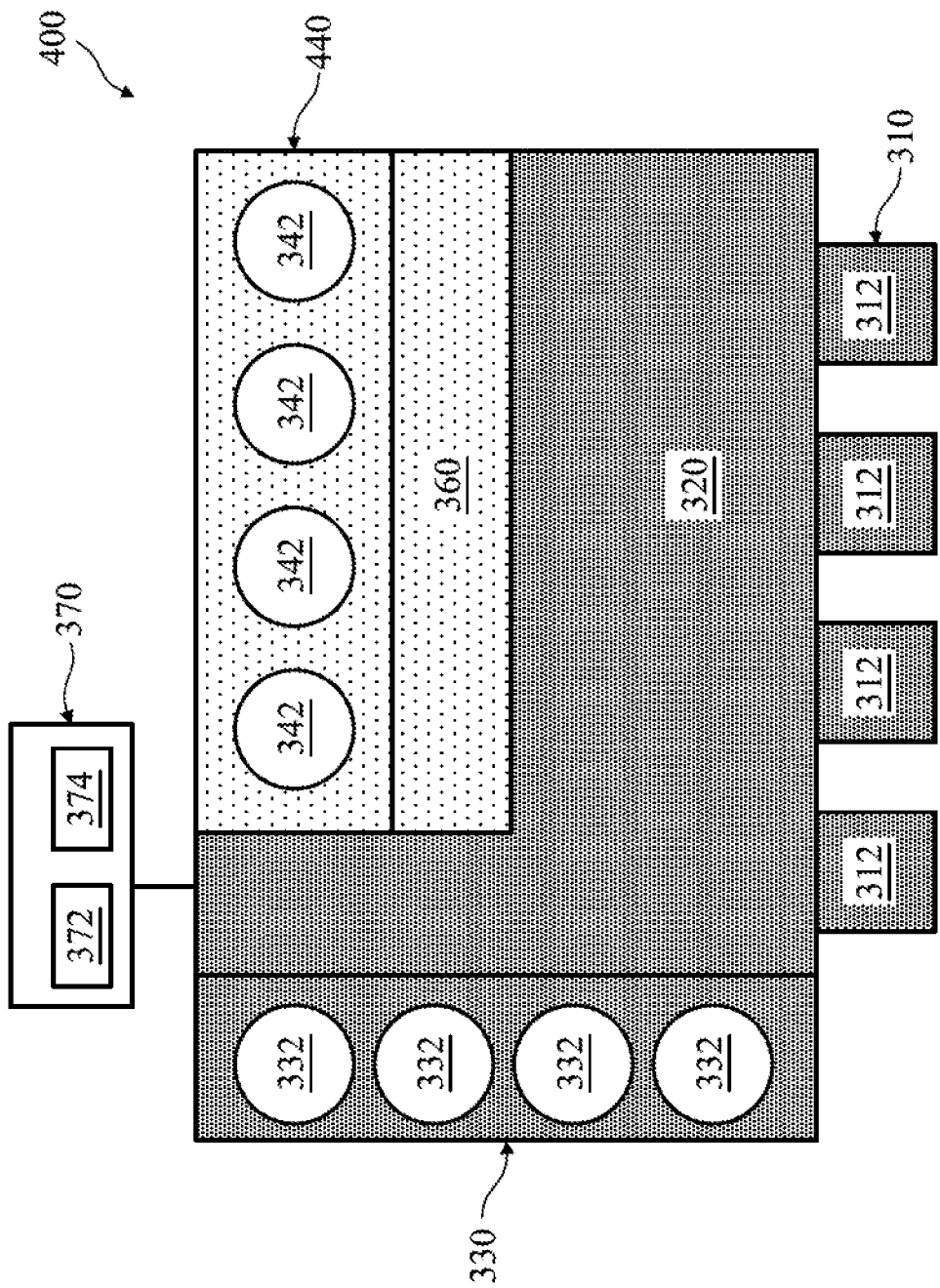
FIG. 4 is a plan view of a semiconductor processing system, in accordance with some embodiments.

FIG. 4 is a plan view of a semiconductor processing system 400 that can be used for performing the two-step thermal treatment process described above in FIGS. 2C and 2D, in accordance with some embodiments.

Referring to FIG. 4, in some embodiments, the semiconductor processing system 400 includes a loading unit 310, a first transfer unit 320, a spin coating unit 330, a thermal treatment unit 440, a second transfer unit 360, and a controller 370. In comparison with the semiconductor processing system 300 of FIG. 3, the semiconductor processing system 400 includes a single thermal treatment unit 440 which can be used to perform both first thermal treatment step and second thermal treatment step. Components in the semiconductor processing system 400 that are the same or similar to those in FIG. 3 are given the same references numbers, and detailed description thereof is thus omitted.

The thermal treatment unit 440 in the semiconductor processing system 400 is coupled to an inert gas source and an oxygen gas source. The inert gas source is configured to supply inert gas to the thermal treatment unit 440 for creating an inert atmosphere. In some embodiments, the oxygen level in the inert atmosphere is less than about 1%. The oxygen gas source is configured to supply oxygen or air to the thermal treatment unit 440 for creating an ambient atmosphere. In some embodiments, the ambient atmosphere has an oxygen level greater than about 20%.

During operation, a substrate, for example, substrate 202 in FIG. 2A is first transferred into the spin coating unit 330 from a load port 312 via the first transfer unit 320, and in the spin coating unit 330 the substrate 202 is coated with a SOC layer 220. After deposition, in some embodiments, a soft bake step is performed under an ambient atmosphere during which the solvent in the SOC layer 200 is substantially removed. The substrate 202 is then transferred into the thermal treatment unit 440 via the first and second transfer units 320, 360. The thermal treatment unit 440 is first purged with an inert gas until an inert atmosphere having an oxygen level, for example, less than about 5%, less than about 4%, less than about 3%, less than about 2%, or less than about 1% is established in the thermal treatment unit 440. The first thermal treatment step is then performed at a first temperature below the cross-linking temperature of the precursor polymer to allow the flow of the SOC layer 220 so as to reduce the thickness variation of the SOC layer 220 across the substrate 202. Next, the oxygen is supplied into the thermal treatment unit 440 to create an ambient atmosphere having an oxygen greater than, for example, 20%. The second thermal treatment step is then performed at a second temperature above the cross-linking temperature of the precursor polymer to cross-link the precursor polymer. The resulting cross-linked SOC layer 220 thus has a reduced thickness variation across the substrate 202.

Figure 5:
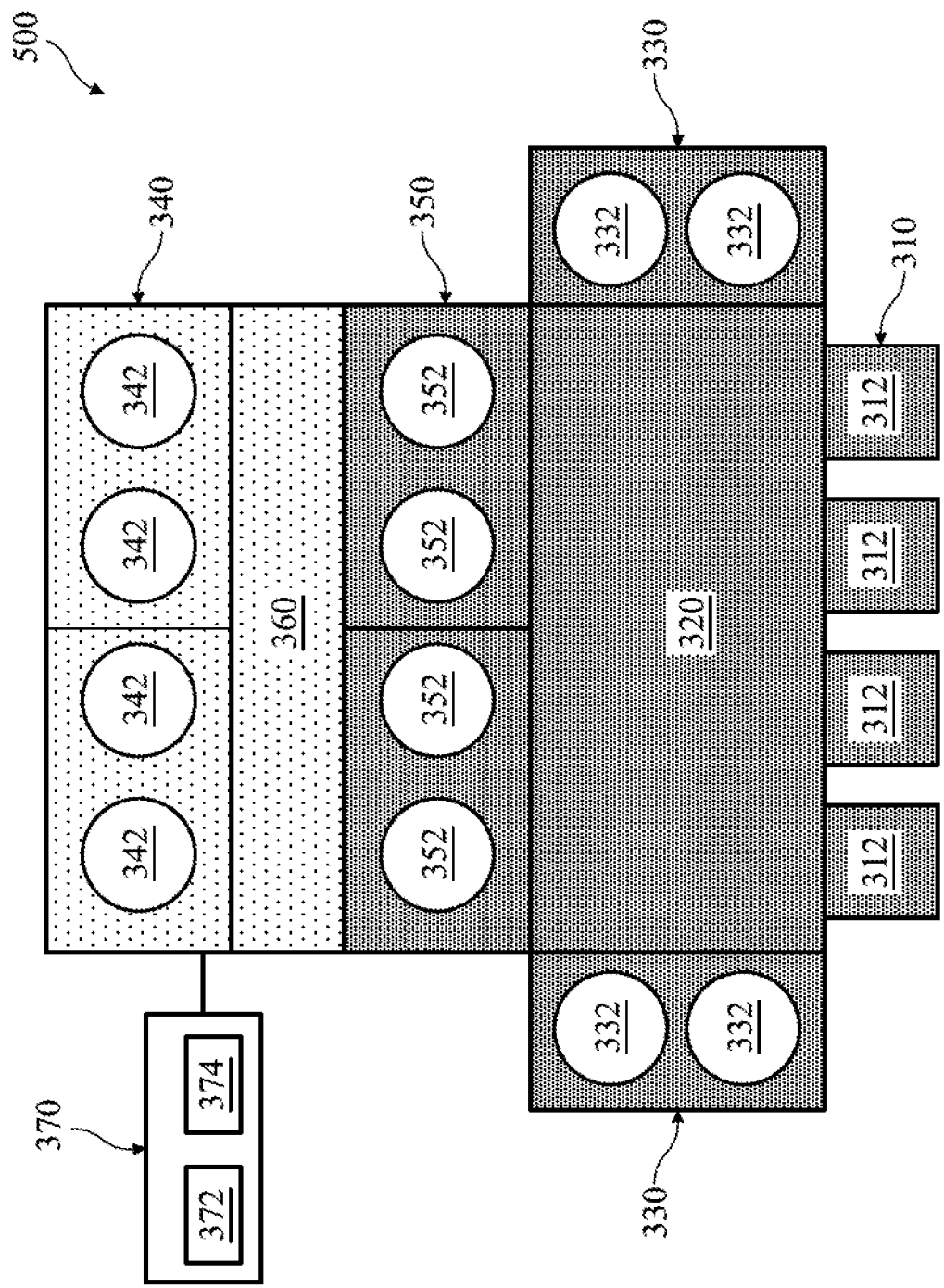
FIG. 5 is a plan view of a semiconductor processing system, in accordance with some embodiments.

FIG. 5 is a plan view of a semiconductor processing system 500 that can be used for performing the two-step thermal treatment process described above in FIGS. 2C and 2D, in accordance with some embodiments.

Referring to FIG. 5, in some embodiments, the semiconductor processing system 500 includes a loading unit 310, a first transfer unit 320, a spin coating unit 330, a thermal treatment unit 440, a second thermal treatment unit 350, a second transfer unit 360, and a controller 370. In comparison with the semiconductor processing system 300 of FIG. 3, the semiconductor processing system 500 is a tandem-type processing system in which the processing stations, such as spin coaters 332, the first baking stations 342, and the second baking stations 352, are groups in pairs. Each pair of processing stations, e.g., spin coaters 332, the first baking stations 342, and the second baking stations 352 is located in a common housing provided with shared processing resources, such as a common processing liquid and/or a common gas exhaust/pumping system. Components in the semiconductor processing system 500 that are the same or similar to those in FIG. 3 are given the same references numbers, and detailed description thereof is thus omitted. The operation of the semiconductor processing system 500 is similar to that of semiconductor processing system 300 described above in FIG. 3, and detailed description thereof is thus omitted.

Figure 6:
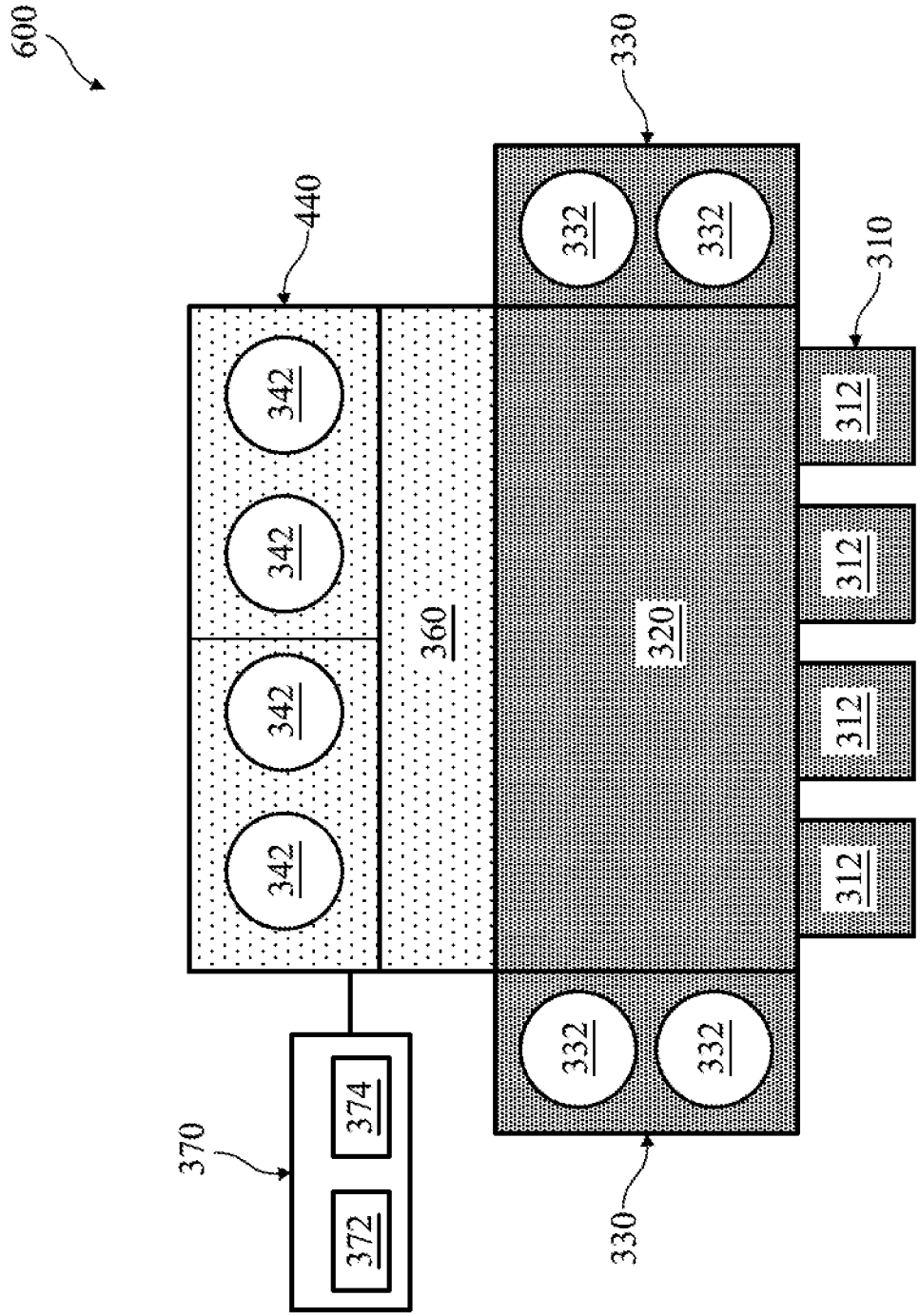
FIG. 6 is a plan view of a semiconductor processing system, in accordance with some embodiments.

FIG. 6 is a plan view of a semiconductor processing system 600 that can be used for performing the two-step thermal treatment process described above in FIGS. 2C and 2D, in accordance with some embodiments.

Referring to FIG. 6, in some embodiments, the semiconductor processing system 600 includes a loading unit 310, a first transfer unit 320, a spin coating unit 330, a thermal treatment unit 440, a second transfer unit 360, and a controller 370. In comparison with the semiconductor processing system 500 of FIG. 5, the semiconductor processing system 500 includes a single thermal treatment unit 440 which can be used to perform both first thermal treatment step and second thermal treatment step. Components in the semiconductor processing system 600 that are the same or similar to those in FIGS. 3-5 are given the same references numbers, and detailed description thereof is thus omitted. The operation of the semiconductor processing system 600 is similar to that of semiconductor processing system 400 described above in FIG. 4, and detailed description thereof is thus omitted.

One aspect of this description relates to a method of forming a semiconductor structure. The method includes etching a dielectric layer on a substrate to form a plurality of trenches. The plurality of trenches includes a plurality of first trenches in a first region and at least one second trench in a second region. The first region has a pattern density greater than the second region. The method further includes depositing a spin-on coating (SOC) layer on the substrate. The SOC layer fills the plurality of trenches. The SOC layer overlying the plurality of first trenches has a first thickness and the SOC layer overlying the at least one second trench has a second thickness. The first thickness is greater than the second thickness. The method further includes performing a two-step thermal treatment process on the SOC layer. A first thermal treatment step in the two-step thermal treatment process is conducted at a first temperature below a cross-linking temperature of the SOC layer to cause flow of the SOC layer, and a second thermal treatment step in the two-step thermal treatment process is conducted at a second temperature to cause cross-linking of the SOC layer.

Another aspect of this description relates to a method of forming a semiconductor structure. The method includes etching a dielectric layer on a substrate to form a plurality of first trenches having a first pattern density in a first region of the substrate and a plurality of second trenches having a second pattern density in a second region of the substrate. The first pattern density is greater than the second pattern density. The method further includes applying a spin-on coating (SOC) layer on the substrate to fill the plurality of first trenches and the plurality of second trenches. The SOC layer overlying the plurality of first trenches is thicker than the SOC layer overlying the plurality of second trenches. The method further includes baking the SOC layer at a first temperature to remove a solvent from the SOC layer. The method further includes heating the SOC layer to a second temperature under a first atmosphere to reduce a thickness variation of the SOC layer in the first region and the second region. The second temperature is higher than the first temperature, and the thickness variation of the SOC layer is reduced by at least about 50%. The method further includes cross-linking the SOC layer at a third temperature under a second atmosphere. The third temperature is higher than the second temperature, and the second atmosphere has a higher oxygen level than the first atmosphere.

Still another aspect of this description relates to a semiconductor processing system. The system includes a spin coating unit configured to apply a spin-on coating (SOC) layer on a substrate. The system further includes at least one thermal treatment unit configured to perform a two-step thermal treatment process on the SOC layer. The first thermal treatment step in the two-step thermal treatment process is conducted at a first temperature below a cross-linking temperature of the SOC layer to planarize the SOC layer, and the second thermal treatment step in the two-step thermal treatment process is conducted at a second temperature to cross-link the SOC layer. The system further includes at least one transfer unit configured to transfer the substrate between the spin coating unit and the at least one thermal treatment unit.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor processing system, comprising:
a spin coating unit configured to apply a spin-on coating (SOC) layer on a substrate;
a thermal treatment unit configured to perform a two-step thermal treatment process on the SOC layer, wherein a first thermal treatment step in the two-step thermal treatment process is conducted at a first temperature to cause flow of the SOC layer and under a first atmosphere with an oxygen level less than 5%, and a second thermal treatment step in the two-step thermal treatment process is conducted at a second temperature to cause cross-linking of the SOC layer and under a second atmosphere with an oxygen level greater than 20%, wherein the first temperature is below a cross-linking temperature of the SOC layer;
an inert gas source coupled to the thermal treatment unit, the inert gas source configured to supply an inert gas to the thermal treatment unit such that the thermal treatment unit is maintained at the first atmosphere during the first thermal treatment step;
an oxygen gas source coupled to the thermal treatment unit, the oxygen gas source configured to supply oxygen or air to the thermal treatment unit such that the thermal treatment unit is maintained at the second atmosphere with during the second thermal treatment step;
a first transfer unit configured to transfer the substrate into the spin coating unit; and
a second transfer unit configured to transfer the substrate out of the thermal treatment unit.

2. The semiconductor processing system of claim 1, further comprising a load port configured to support the substrate before transferring the substrate into the spin coating unit.

3. The semiconductor processing system of claim 2, wherein the load port, the spin coating unit and the first transfer unit is maintained under the second atmosphere.

4. A semiconductor processing system, comprising:
a spin coating unit configured to apply a spin-on coating (SOC) layer on a substrate;
a first thermal treatment unit configured to perform a first thermal treatment to the SOC layer, wherein the first thermal treatment is conducted at a first temperature and under a first atmosphere with an oxygen level less than 5%, wherein at the first temperature, flow of the SOC layer occurs to planarize the SOC layer; and
a second thermal treatment unit configured to perform a second thermal treatment to the SOC layer, wherein the second thermal treatment is conducted at a second temperature higher than the first temperature and under a second atmosphere with an oxygen level greater than 20%, wherein at the second temperature, cross-linking of the SOC layer occurs to form a crosslinked SOC layer.

5. The semiconductor processing system of claim 4, further comprising a load port for supporting the substrate.

6. The semiconductor processing system of claim 5, further comprising a first transfer unit coupled to the load port, the spin coating unit and the second thermal treatment unit, the first transfer unit configured to transfer the substrate from the load port into the spin coating unit and transfer the substrate from the second thermal treatment unit to the load port.

7. The semiconductor processing system of claim 6, wherein the first transfer unit is maintained under an ambident atmosphere with an oxygen level greater than 20%.

8. The semiconductor processing system of claim 7, wherein the first transfer unit comprises a robot.

9. The semiconductor processing system of claim 7, further comprising a second transfer unit coupled to the first transfer unit, the first thermal treatment unit and the second thermal treatment unit, the second transfer unit configured to transfer the substrate from the first transfer unit to the second thermal treatment unit.

10. The semiconductor processing system of claim 9, wherein the second transfer unit is maintained under an inert atmosphere with an oxygen level less than 5%.

11. The semiconductor processing system of claim 4, wherein the spin coating unit is maintained under an ambient atmosphere with an oxygen level greater than 20%.

12. The semiconductor processing system of claim 4, further comprising a controller configured to control operations of the semiconductor processing system.

13. A method of forming a semiconductor structure in a semiconductor processing system, comprising
applying a spin-on coating (SOC) layer onto a substrate in a spin coating unit of the semiconductor processing system;
performing a first thermal treatment to the SOC layer in a first thermal treatment unit of the semiconductor processing system, wherein the first thermal treatment is conducted at a first temperature and under a first atmosphere with an oxygen level less than 5%, wherein at the first temperature, flow of the SOC layer occurs to planarize the SOC layer; and
performing a second thermal treatment to the SOC layer in a second thermal treatment unit of the semiconductor processing system, wherein the second thermal treatment is conducted at a second temperature higher than the first temperature and under a second atmosphere with an oxygen level greater than 20%, wherein at the second temperature, cross-linking of the SOC layer occurs to form a crosslinked SOC layer.

14. The method of claim 13, wherein the second temperature is at least 20° C. higher than the first temperature.

15. The method of claim 13, wherein the spin coating unit is maintained under an ambident with an oxygen level greater than 20%.

16. The method of claim 13, wherein the SOC layer comprises a precursor polymer including a cross-linkable group selected from —OH, —SH, —NH$_2$, —C(=O)OH, —C(=S)OH, —C(=O)SH, —C(=S)SH, —CH=CH$_2$, —C(=O) —CH=CH$_2$, —C(=O) —C(CH$_3$)=CH$_2$ or epoxy.

17. The method of claim 13, further comprising transferring the substrate into the spin coating unit and transferring the substrate from the spin coating unit to the first thermal treatment unit using a first transfer unit of the semiconductor processing system.

18. The method of claim 17, wherein the first transfer unit is maintained at an ambient atmosphere with an oxygen level greater than 20%.

19. The method of claim 17, further comprising transferring the substrate from the first thermal treatment unit to the second thermal treatment unit using a second transfer unit of the semiconductor processing system.

20. The method of claim 13, further comprising heating the SOC layer at a third temperature prior to transferring the substrate to the first thermal treatment unit to remove a solvent in the SOC layer.

* * * * *